US007214468B2

(12) United States Patent
Takahashi et al.

(10) Patent No.: US 7,214,468 B2

(45) **Date of Patent: *May 8, 2007**

(54) LITHOGRAPHIC PRINTING PLATE MATERIAL AND PRINTING METHOD

(75) Inventors: Rieko Takahashi, Tokyo (JP); Masaki Miyoshi, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/797,870

(22) Filed: Mar. 10, 2004

(65) Prior Publication Data

US 2004/0185377 A1 Sep. 23, 2004

(30) Foreign Application Priority Data

Mar. 20, 2003 (JP) ............................ 2003-077663

(51) Int. Cl.
*G03F 7/09* (2006.01)

(52) U.S. Cl. ................ 430/271.1; 430/138; 430/281.1; 430/302; 430/309; 430/435; 430/494; 430/944; 430/945

(58) Field of Classification Search ................ 430/138, 430/270.1, 271.1, 272.1, 281.1, 302, 309, 430/434, 435, 494, 944, 945
See application file for complete search history.

(56) References Cited

U.S. PATENT DOCUMENTS

| | | | | |
|---|---|---|---|---|
| 6,110,644 | A * | 8/2000 | Vermeersch et al. | 430/302 |
| 6,688,228 | B2 * | 2/2004 | Hiraoka | 101/462 |
| 2004/0154490 | A1 * | 8/2004 | Mori | 101/467 |
| 2005/0064339 | A1 * | 3/2005 | Miyoshi | 430/300 |

FOREIGN PATENT DOCUMENTS

| | | | |
|---|---|---|---|
| EP | 1 145 848 | A2 * | 10/2001 |
| EP | 1 266 751 | A2 | 12/2002 |
| EP | 1 334 841 | A2 | 8/2003 |
| EP | 1 334 842 | A2 | 8/2003 |
| JP | 2001334766 | A * | 12/2001 |

* cited by examiner

*Primary Examiner*—Barbara L. Gilliam
(74) *Attorney, Agent, or Firm*—Lucas & Mercanti, LLP

(57) ABSTRACT

A lithographic printing plate material is disclosed, comprising a flexible support having thereon a hydrophilic layer and an image forming layer, wherein the flexible support having the hydrophilic layer exhibits a transmission density of 0.5 to 1.2, and the outermost surface of an unexposed area of the image forming layer exhibiting a glossiness of 0.1 to 10. A printing method is also disclosed.

20 Claims, No Drawings

LITHOGRAPHIC PRINTING PLATE MATERIAL AND PRINTING METHOD

FIELD OF THE INVENTION

The present invention relates to a lithographic printing plate material (hereinafter, also denoted simply as printing plate material) and a printing method using laser or near infrared light exposure.

BACKGROUND OF THE INVENTION

A CTP (Copy-to-Plate) system which is inexpensive and easy in handling and has printability equivalent to PS plates (presensitized litho plates) has been desired along with digitization of printing data.

In particular, there recently have been increased expectations for a so-called process-less plate which needs no processing with specific chemicals and is applicable to printing machines provided with direct imaging (also denoted simply as DI) functions.

However, such a process-less plate is offered substantially only for use in DI printing machines under present circumstances and any process-less plate exhibiting sufficient performance as a general purpose printing plate material has not been provided.

One reason that the process-less plate is still insufficient for use as a general-purpose printing plate material concerns its low image visibility after exposure (hereinafter, also denoted as exposure visibility).

In direct image printing machines, position proofing is substantially not conducted during the period that a printing plate material is set on a plate cylinder and imagewise exposed, then, printing is conducted, so that even in cases of low exposure visibility, no serious problem occurs. However, in cases when used as a general purpose printing plate material, position proofing is needed even when image-forming in a CTP system, requiring exposure visibility.

The main trend in process-less plates is a so-called thermal type using infrared laser exposure to perform image formation. This thermal type is mainly classified into two types.

One of such thermal type printing plate materials is a ablation type, in which two layers differing in affinity for an aqueous dampening liquid or ink used in printing are provided on a substrate and the layer on the surface side (hereinafter, also denoted simply as surface layer) is ablated by laser light exposure to perform complete removal.

In such a type, the foregoing two layer differing in color under visible light can provide exposure visibility and examples thereof include a printing plate material disclosed in published Japanese translations of PCT international publication for patent applications No. 2002-514984.

However, this type of printing plate material needs to provide a suction mechanism to completely remove flying pieces on the ablated surface layer within the exposure apparatus, producing problems such that apparatus costs greatly increase. Further, exposure requiring relatively high energy necessitates lowering a beam line speed at the time of exposure (for example, reducing the rotation speed of a exposure drum), leading to reduced productivity of image formation.

The other thermal type printing plate material is an development on press (or development on a printing machine). This type of printing plate material comprises two layers differing in affinity for an aqueous dampening liquid or ink used in printing on a substrate, in which laser light exposure is conducted to change adhesion between the surface layer and the under-layer and low-adhesive portions are removed on press. Removal of the low-adhesive portions can be carried out by contact with a dampening liquid-supplying roller, by dissolution or swelling by the supply of a dampening liquid, by contact with an ink roller, by peeling-off employing the ink tackiness property, or by contact with a blanket drum. At least a part of the surface layer is removed on press in the printing plate material of a type of development on press so that the layer to be removed is desired not to be colored to prevent color-staining of the dampening liquid or the ink of a printing machine. It is therefore difficult to provide superior visibility.

For example, JP-A No. 11-240270 (hereinafter, the term JP-A refers to Japanese patent application publication) disclosed a printing plate material comprising a heat-sensitive layer containing an infrared absorption dye and capable of change an optical density upon exposure to light, thereby providing visibility. However, although such infrared absorption dyes generally fade upon exposure to infrared rays, complete fade-away cannot be achieved. Accordingly, when exposed areas of the surface layer are removed, a few colored pieces are mixed with the dampening liquid or ink, causing stains. Further, in cases when unexposed areas of the surface layer are removed, it is necessary to enhance contrast between exposed and unexposed areas, that is, to increase the coloring density of the unexposed area to provide superior visibility, so that visibility and anti-staining of a printing machine are contrary in performance to each other.

For example, JP-A No. 2001-322226 discloses an image recording method to obtain contrast between exposed and unexposed areas of a development-on-press type printing plate material substantially without containing colored material in the layer to be developed on press, in which by using a planographic printing plate comprising a recording layer mainly containing hot melting particles and a porous layer containing voids on a support, the voids in the porous layer are filled with the thermally fused particles to record a contrast image of transparency and non-transparency.

Although this method achieves relatively favorable visibility without causing stains on the printing machine, disadvantages were such that since a light transmission property of the printing plate material was employed to achieve contrast formation, constant exposure visibility (e.g., difference in reflection density between exposed and unexposed areas) was not always achieved only by the printing plate material.

SUMMARY OF THE INVENTION

It is an object of the present invention to provide a lithographic printing plate material exhibiting superior exposure visibility of images formed upon exposure to lasers or near-infrared rays (hereinafter, also denoted simply as visibility) and enhanced sensitivity without producing stains in the printing machine, whereby a layout proof is stably obtained, and a printing method by the use of the same.

The foregoing object can be accomplished by the following constitution.

Thus, one aspect of the invention is directed to a lithographic printing plate material comprising a flexible support having thereon a hydrophilic layer and an image forming layer, wherein the flexible support having the hydrophilic layer exhibits a transmission density of 0.5 to 1.2, and the outermost surface of an unexposed area of the image forming layer exhibiting a glossiness of 0.1 to 10.

Another aspect of the invention is directed to a printing method, wherein a printing plate described in the foregoing is exposed to laser or an near-infrared ray and is subjected to printing without being subjected to development.

The present invention has come into being as a result of broad study by the inventors of this application. Thus, it was found that coating a porous hydrophilic layer and a layer containing a heat-melting material exhibiting a melting point of 40 to 300° C. on a substrate enhances exposure visibility of the image obtained when imagewise exposing a printing plate material to laser or near-infrared rays and contrast to an unexposed area, leading to improved layout proofing.

DETAILED DESCRIPTION OF THE INVENTION

Flexible Support

As a flexible support usable in this invention (hereinafter, also denoted simply as a support or a substrate) are used commonly known flexible supports which are used as a substrate of lithographic printing plates.

Flexible supports include plastic film (hereinafter, also denoted simply as film), specifically, polyethylene terephthalate (PET), polyethylene naphthalate, polyimide, polyamide, polycarbonate, polysulfone, polyphenylene oxide and cellulose esters. Of these, polyethylene terephthalate and polyethylene naphthalene are preferred. The coating surface of these plastic films is preferably subjected to a treatment for promoting adhesiveness or subbing layer coating. Treatments for promoting adhesiveness include, for example, a corona discharge treatment, a flame treatment, a plasma treatment a UV exposure treatment. The subbing layer include a layer containing gelatin or a latex. Further, commonly known tin sols may be included therein or known backing layers may be formed. The backing layer may be colored.

The foregoing films may be subjected to commonly known treatments to enhance their strength or dimensional stability. Further, the films may be colored and the use of a colored support enables enhancement of the transmission density of the upper layer on the support, forming an image with enhanced contrast between exposed and unexposed areas and leading to enhanced layout proofing. In cases when the upper layer on the support exhibits a transmission density of less than 0.7, the use of a colored support is preferred.

Hydrophilic Layer

In this invention, the support having thereon a hydrophilic layer exhibits a transmission density of 0.5 to 1.2. The following compounds are usable as material for use in the hydrophilic layer of the printing plate material of this invention. Materials forming the hydrophilic layer are preferably metal oxides, and more preferably fine metal oxide particles (hereinafter, also denoted simply as fine particles or particles). Specific examples thereof include colloidal silica, alumina sol, titania sol and other metal oxide sols. There is usable any form of metal oxide sols, including spherical form, a feather form and other forms. The average particle size is preferably 3 to 100 nm and the combination of two or more kinds of fine particles differing in average particle size is also usable. The particle surface may be subjected to a surface treatment. The average particle size is determined in a manner that fine metal oxide particles are electron microscopically observed to determine particle sizes of random 100 particles and the average value thereof is defined as the average particle size.

Further, the fine metal oxide particles can function as a binder employing their film forming capability, and the use of organic binders, which results in reduced lowering of hydrophilicity, is suitable for the hydrophilic layer described above.

The use of colloidal silica is specifically preferred in this invention. Colloidal silica advantageously exhibits enhanced film forming capability even when dried at a relatively low temperature, leading to superior strength. Preferred examples of colloidal silica include a necklace form colloidal silica and fine particulate colloidal silica having an average size of less than 20 nm. The colloidal silica solution is preferably alkaline.

Necklace form colloidal silica preferably used in this invention is a generic term for an aqueous dispersion of spherical silica particles having primary particle diameter on the order of a few nm. Herein, the necklace form colloidal silica means "pearl necklace form" colloidal silica in which spherical colloidal silica particles having a primary particle diameter of 10 to 50 nm are bonded in a length of 50 to 400 nm. The pearl necklace form means that colloidal silica particles are linked in a pearl necklace form. The bond between silica particles forming the necklace form colloidal silica is contemplated to be —Si—O—Si— which is formed by dehydration of —SiOH groups existing on the silica particle surface.

Examples of commercially available necklace form colloidal silica include "SNOWTEX-PS" series (available from Nissan Chemical Industries, Ltd.). Examples of products SNOWTEX-PS-S (an average size of linked particles of ca. 10 nm), SNOWTEX-PS-M (an average size of linked particles of ca. 120 nm), SNOWTEX-PS-L (an average size of linked particles of ca. 170 nm), and corresponding acidic products are SNOWTEX-PS-S-O, SNOWTEX-PS-M-O and SNOWTEX-PS-L-O, respectively. Incorporation of the necklace form colloidal silica enables maintainong layer strength, while keeping porosity of the layer, which is also preferably used as material to make the hydrophilic layer porous. Specifically, the use of alkaline SNOWTEX-PS-S, SNOWTEX-PS-M or SNOWTEX-PS-L is preferred, which enhances the layer strength of the hydrophilic layer and prevents staining in the background even at a high-volume of printing.

The smaller particle system is known to result in stronger bonding, and a colloidal silica having an average particle size of not more than 20 nm (preferably 3 to 15 nm) is preferred. Of the foregoing colloidal silica, the use of alkaline colloidal silica is specifically preferred, which prevents background staining. Examples of an alkaline colloidal silica having an average particle size falling within the foregoing range include SNOWTEX-20 (average particle size: 10 to 20 nm), SNOWTEX-30 (average particle size: 10 to 20 nm), SNOWTEX-40 (average particle size: 10 to 20 nm), SNOWTEX-N (average particle size: 10 to 20 nm), SNOWTEX-S (average particle size: 8 to 11 nm) and SNOWTEX-XS (average particle size: 4 to 6 nm).

The use of a colloidal silica having an average particle size of not more than 20 nm in combination with the foregoing necklace form colloidal silica is specifically preferred, which enables further enhancement of layer strength, while maintaining porosity of the layer. The ratio of colloidal silica having an average particle size of not more than 20 nm to necklace form colloidal silica is preferably 95/5 to 5/95, more preferably 70/30 to 20/80, and still more preferably 60/40 to 30/70.

Porous metal oxide particles having a size of less than 1 μm are usable as a material to form a porous hydrophilic layer. Preferred examples of the porous metal oxide particles include porous silica or porous aluminosilicate particles and zeolite particles.

Porous silica particles can be prepared in a wet process or in a dry process. In the wet process, an aqueous silicate solution is neutralized to obtain a sol, which is dried and pulverized, or precipitates obtained via neutralization are pulverized. In the dry process, silicon tetrachloride is combusted together with hydrogen and oxygen to obtain sintered silica. The porosity or particle size of the porous silica particles can be controlled by adjusting preparation conditions. Porous silica particles obtained in the wet process are specifically preferred.

Porous aluminosilicate particles can be prepared, for example, in accordance with methods described in JP-A No. 10-71764. Thus, particles are non-crystalline composite particles which are synthesized in a hydrolysis method using aluminum alkoxide and silicon alkoxide as main components. There can be synthesized particles having a ratio of alumina to silica of 1:4 to 4:1. Further, other metal alkoxides may be added in the course of preparation to form three-component or multi-component composite particles. Porosity or the particle size of the composite particles can be controlled by adjusting preparation conditions. With respect to porosity of the particles, the pore volume is preferably not less than 0.5 ml/g, more preferably not less than 0.8 ml/g, and still more preferably 1.0 to 2.5 ml/g.

The core volume is closely related to water retentivity of the layer. A greater pore volume enhances water retentivity, enhancing stain resistance and increasing the water content latitude. A pore volume exceeding 2.5 ml/g render the particles brittle, resulting in reduced durability. A pore volume of less than 0.5 ml/g results in insufficient printing performance.

Zeolite is also usable as a material to make the hydrophilic layer porous. Zeolite is a crystalline aluminosilicate, which is a porous material having a pore size of 0.3 to 1 nm and a regular three-dimensional network structure. Natural or synthetic zeolite is represented by the following general formula:

$$(M_1, M_2^{1/2})_m(Al_mSi_nO_{2(m+n)}).xH_2O$$

wherein $(M_1, M_2^{1/2})$ represents a changeable cation, $M_1$ is Li, $Na^+$, $K^+$, $Tl^+$, $Me_4N^+$ (or TMA), $Et_4N^+$ (or TEA), $Pr_4N^+$ (or TPA), $C_7H_{15}N^{2+}$ or $C_8H_{16}N^+$, and $M_2$ is $Ca^{2+}$, $Mg^{2+}$, $Ba^{2+}$, $Sr^{2+}$ or $C_8H_{18}N_2^{2+}$; n≧m and a value of m/n, i.e., Al/Si ratio is not more than 1. A higher Al/Si ratio results in a more changeable cation content, giving a higher polarity and leading to higher hydrophilicity. The Al/Si ratio is preferably 0.4 to 1.0, and more preferably 0.8 to 1.0; and x is an integer.

Zeolite particles usable in this invention are synthetic zeolite particles which are stable in Al/Si ratio and exhibit a sharp particle size distribution, including zeolite A: $Na_{12}(Al_{12}Si_{12}O_{48}).27H_2O$, Al/Si ratio of 1.0; zeolite X; $Na_{86}(Al_{86}Si_{106}O_{384}).264H_2O$, Al/Si ratio of 0.811; and zeolite Y: $Na_{56}(Al_{56}Si_{136}O_{384}).2507H_2O$, Al/Si ratio of 0.412. Incorporation of porous particles exhibiting a Al/Si ratio of 0.4 to 1.0 and high hydrophilicity enhances hydrophilicity of the hydrophilic layer, leading to reduced staining in printing and increased water content latitude. Further, finger print staining is also reduced. An Al/Si ratio of less than 0.4 results in insufficient hydrophilicity, leading to a reduced improvement.

The hydrophilic layer of the printing plate material of this invention may contain lamellar clay mineral particles (hereinafter, also denoted as lamellar mineral). Examples of lamellar minerals include kaolinite, halocite, talc, smectite (e.g., montmorillonite, beidellite, hectorite, sabonite, etc.), vermiculite, mica, chlorite, hydrotalcite and lamellar polysilicates (e.g., kanemite, makatite, ialite, magadite, kenyaite, etc.). Of these, it is contemplated that a unit layer having a higher charge density exhibits a higher polarity and higher hydrophilicity. The charge density is preferably at least 0.25 and more preferably at least 0.6. Lamellar minerals having such a charge density include smectite (having a charge density of 0.25 to 0.5; negative charge) and vermiculite (having a charge density of 0.6 to 0.9; negative charge). Specifically, synthetic fluorinated mica, which has a stable quality such as particle size, is available and preferred. Of synthetic mica, one which is capable of swelling is preferred and one which is capable of freely swelling is more preferred. Of the foregoing lamellar minerals, intercalation compounds (e.g., pillared crystals), deionized ones and surface-treated ones are also usable.

As to the tabular lamellar mineral particles, the average particle size (maximum particulate length) is preferably less than 1 μm and the average aspect ratio is preferably not less than 50, when contained in the layer. A particle size falling within the foregoing range provides continuousness in the planar direction and softness as a feature of lamellar particles to the coated layer forming a film which is resistant to cracking and tough in the dry state.

In a coating solution containing a particulate material, a thickening effect of the lamellar clay mineral prevents precipitation of the particulate material. An average particle size of more than 1 μm causes non-uniformity, often resulting in locally lowered strength. An average aspect ratio less than the foregoing range results in reduced number of tabular grains per addition amount, leading to insufficient viscosity and reduced prevention of precipitation.

The content of lamellar mineral particles is preferably 0.1% to 30%, and more preferably 1% to 10$ by weight, based on the entire layer. Specifically, swelling synthetic fluorinated mica or smectite, which is effective even in a small amount, is preferred. The lamellar mineral particles may be added in a powdery form to a coating solution. As it can be well dispersed in a simplified manner (requiring no dispersing process such as media dispersion), it is preferred that the lamellar mineral particles is singly swelled in water to for a gel, which is added to a coating solution.

There may be used an aqueous silicate solution as an additive material in hydrophilic layer. Alkali metal silicates such as sodium silicate, potassium silicate and lithium silicate are preferred as a silicate, in which, to prevent dissolution of inorganic particles, it is preferred to select the ratio of $SiO_2/M_2O$ (M: alkali metal) so that the pH of the coating solution added with a silicate is not more than 13.

There can be used inorganic polymers or organic-inorganic hybrid polymers obtained by using metal alkoxides, so-called sol-gel processing. Formation of inorganic polymers or organic-inorganic hybrid polymers employing sol-gel processing is described, for example, in S. Sakuhana "Sol-Gel-ho no Ohyo" (Application of Sol-Gel Processing, published by Agne Shofusha) and known methods described in references cited in this application are also applicable.

There may be used water-soluble resins. Specific examples of such resins include polysaccharides, polyethyleneoxide, polypropyleneoxide, polyvinyl alcohol, polyethylene glycol (PEG), conjugated diene type polymer latex of styrene-butadiene copolymer and methyl methacrylate butadiene copolymer, acryl type polymer latex, vinyl type polymer latex, polyacrylamide, and polyvinylpyrrolidone. Of these, polysaccharides are preferred as a water-soluble resin used in this invention. Polysaccharides include, for example, starch, celluloses, polyuronic acid and pullulan. Of these, cellulose derivatives, such as methyl cellulose salts, carboxymethyl cellulose salts and hydroxyethyl cellulose salts are preferred and carboxymethyl cellulose sodium salt or ammonium salt are more preferred. Incorporating polysaccharides into a hydrophilic layer effectively renders the surface form of the hydrophilic layer into the preferred state.

The hydrophilic layer surface preferably a rugged structure having a pitch of 0.1 to 20 μm, such as a grained aluminum plate of a PS plate, thereby enhancing water retentivity or retention of imaging areas. A rugged structure can also be formed by incorporation of a filler of an optimal particle size into a hydrophilic layer matrix. A preferred structure having superior suitability for printing can be obtained in a manner that alkaline colloidal silica and a water-soluble polysaccharide are included in a coating solution of the hydrophilic layer and phase separation is allowed to occur when coating and drying the hydrophilic layer. Forms of the rugged structure (such as pitch and surface roughness) can optimally be controlled by adjusting the kind and quantity of an alkaline colloidal silica, the kind and quantity of a water-soluble polysaccharide, the kind and quantity of other additives, the solid concentration of a coating solution, wet layer thickness and drying conditions.

At least a part of a water-soluble resin incorporated into the hydrophilic layer exists preferably in the form of an aqueous solution, that is, in a state capable of being dissolved out in water. There is concern that even a water-soluble material, which is cured with a curing agent and becomes insoluble, lowers its hydrophilicity, resulting in deteriorated printing suitability.

Cationic resins may be contained, including polyalkylene-polyamines or their derivatives such as polyethyleneamine, polypropylene-polyamine, acryl resin containing a tertiary amino group or a quaternary ammonium group, and diacrylamine. Cationic resin may be added in the form of solid fine particles, such as cationic micro-gel described in JP-A No. 6-161101.

Water-soluble surfactants may be added to a coating solution of the hydrophilic layer to improve coatability. Silicon-containing or fluorine-containing surfactants are usable. The use of silicon-containing surfactants, which causes no printing stain, are specifically preferred. The surfactant content is preferably 0.01% to 3%, and more preferably 0.03% to 1% by weight, based on the overall hydrophilic layer (solids of a coating solution).

The hydrophilic layer may contain a phosphate. In this invention, an alkaline coating solution of the hydrophilic layer is preferable so that addition of phosphates such as trisodium phosphate or disodium hydrogen phosphate is preferred. Incorporation of phosphates improves halftone blow-ups in printing. Addition of a phosphate is preferably 0.1 to 5%, and more preferably 0.5% to 2% by weight, in terms of an effective amount, except for hydrates.

The hydrophilic layer may contain light-to-heat conversion material. A particulate light-to-heat conversion material preferably has a particle size of less than 1 μm.

The hydrophilic layer preferably contains inorganic particles or inorganic material-coated particles, having a size of less than 1 μm. Inorganic particles usable in this invention include commonly known metal oxide particles such as silica, alumina, titania, and zirconia. Porous metal oxide particles are preferred to prevent sedimentation in the coating solution. Preferred examples of porous metal oxide particles include porous silica particles and porous aluminosilicate particles.

Inorganic material-coated particles are comprised of, for example, organic core particles such as PMMA (polymethyl methacrylate) or polystyrene, which are further coated with inorganic particles having a size less than the core particles. The inorganic particles have a size of 1/100 to 1/10 of the core particles. Commonly known metal oxide particles of silica, alumina, titania or zirconia are usable as inorganic particles. Coating can be carried out by known methods. A dry coating method is preferred, using a hybridizer in which core material particles and coating material particles are collided with each other at a high speed in an air to allow the coating particles to cut into the surface of the core material particles to be secured and coated thereon. There are also usable metal-plated particles comprised of organic core particles. Examples of such particles include gold-plated resin particles, Micropearl AU, available from Sekisui Kagaku Kogyo Co., Ltd. The particle size is preferably 1.5 to 8 μm, and more preferably 2 to 6 μm. A particle size of more than 10 μm is feared to result in lowered resolution of image formation and staining of blanket. Incorporation of particles of not less than 1 μm is preferably in an amount of 1% to 50%, and more preferably 5% to 40% by weight, based on the whole hydrophilic layer.

A lower content of carbon containing material such as organic resin or carbon black in the whole hydrophilic layer is preferred to enhance hydrophilicity, more preferably less than 9%, and still more preferably less than 5% by weight.

There may be provided an underlayer below both the hydrophilic layer and the image forming layer. Materials used in the underlayer are the same as those used in the hydrophilic layer. A porous underlayer is less advantageous and since non-porosity enhances film strength, a lesser quantity of porous material contained in a hydrophilic matrix is preferred, while no content at all thereof is more preferred. Incorporation of particles having a size of not less than 1 μm is preferably in an amount of 1% to 50%, and more preferably 5% to 40% by weight, based on the whole underlayer. A lower content of carbon containing material such as organic resin or carbon black in the whole underlayer is preferred to enhance hydrophilicity, more preferably less than 9%, and still more preferably less than 5% by weight.

Image Forming Layer (Imaging Layer)

The image forming layer contains a heat-melting material. The heat-melting material used in this invention is a thermally meltable material and is preferably in the form of fine particles of a material which is a thermoplastic material exhibiting a relatively low melt viscosity and which is generally classified as wax. Preferred physical properties of a heat-melting material include a softening point of 40 to 120° C. (preferably 40 to 100° C.) and a melting point of 40 to 300° C. (preferably 60 to 300° C., and more preferably 60 to 120° C.). A melting point of less than 40° C. arises problems in storage stability and a melting point of more than 300° C. results in lowered inking sensitivity.

Examples of heat-melting material usable in this invention include paraffin, polyolefin, polyethylene wax, microcrystalline wax and fatty acid type wax. The molecular weight of the foregoing waxes is in the range of 800 to 10,000. To enhance emulsibility, the waxes are oxidized to introduce a polar group such as a hydroxyl group, an ester group, a carboxyl group, an aldehyde group or a peroxide group. Further, to lower the softening point or enhance workability, stearoamide, linolenamide, laurylamide, myristelamide, hardened beef fatty acid amide, palmitoamide, oleic amide, rice fatty acid amide, coconut fatty acid amide, or their methylol-modified compounds, methylenebisstearoamide or ethylenebisstearoamide may be added to the wax. There are also usable coumarone-indene resin, rosin-modified phenol resin, terpene-modified phenol resin, xylene resin, ketone resin, acryl resin, ionomer and the foregoing resin copolymer. Of the foregoing waxes, paraffin, polyethylene, microcrystalline, fatty acid ester and fatty acid are preferred. These materials, which exhibit a relatively low melting point and a low melt viscosity, can achieve high-sensitive image formation. These materials, which are lubricative, reduce damage when shear force is applied to the surface of the printing plate material and enhances resistant to staining due to abrasion marks.

The heat-melting material usable in this invention is preferably water-dispersible and its average particle size is preferably 0.01 to 10.0 mm, and more preferably 0.4 to 3.0 μm. In cases when the average particle size is less than 0.01 μm, heat-melting material readily enters pores of the hydrophilic layer or tiny gaps on the hydrophilic layer surface, or results in insufficient, producing concern of causing background staining. An average particle size of a heat-melting material of more than 10 μm results in lowered resolution.

The heat-melting material may continuously vary from the interior to the uppermost surface or is coated with different material. The content of a heat-melting material is preferably 1% to 90%, and more preferably 5 to 80% by weight of the whole layer.

In one preferred embodiment of this invention, the printing plate material exhibits a difference in L, a*, b* values obtained in white backing between exposed and unexposed areas (ΔE) of 6 to 20. Herein, the L, a*, b* values, which are expressed in terms of the La*b* chromaticity system, are also denoted simply as a La*b* value. Thus, the difference (ΔE) in La*b* value between exposed and unexposed areas is 6 to 20, which is determined from the Lab values obtained in the measurement on the white background. The L, a*,b* values of exposed and unexposed areas which are placed on the white background can be determined using SMP100 (available from Gretag Co.) to determine E in exposed and unexposed areas. As is defined in ISO 13655, when a La*b* value in an exposed area and a Lab value in unexposed area, which are measured on the white background (i.e., white backing), are represented by ($L_1$, $a^*_1$, $b^*_1$) and ($L_2$, $a^*_2$, $b^*_2$), respectively, the difference ΔE between exposed and unexposed areas can be calculated by the following equation:

$$\Delta E=[(L_1-L_2)^2+(a^*_1-a^*_2)^2+(b^*_1-b^*_2)^2]^{0.5}$$

Heat-fusible materials usable in this invention include thermoplastic hydrophobic polymer particulates. The softening temperature of a thermoplastic hydrophobic polymer particulate is specifically no upper limit and preferably lower than the degradation temperature of the polymer particulates. The mean molecular weight (Mw) of a high polymer is preferably 10,000 to 1,000,000.

Specific examples of a high polymer forming polymer particulates include diene (co)polymers such as polypropylene, polybutadiene, polyisoprene and ethylene-butadiene copolymer; synthetic rubbers such as styrene-butadiene copolymer, methyl methacrylate-butadiene copolymer, and acrylonitryl-butadiene copolymer; (metha)acrylic acid esters such as polymethyl methacrylate, methyl methacrylate-methacrylic acid copolymer, methyl acrylate-(N-methylol acrylamide) copolymer, and polyacrylonitrile; vinyl ester copolymers such as (metha)acrylic acid copolymer, polyvinyl acetate, vinyl acetate-vinyl propionate copolymer, and vinyl acetate-ethylene copolymer; vinyl acetate-(2-ethylhexylacrylate) copolymer, polyvinyl chloride, polyvinilidene chloride, polystyrene and their copolymers. Of these, (metha)acrylate (co)polymer, (metha)acrylic acid (co)polymer, vinyl ester (co)polymer, polystyrene and synthetic rubbers are preferred.

Polymer particulates usable in this invention can be formed of a polymer which is prepared by any commonly known polymerization method such as emulsion polymerization, suspension polymerization, solution polymerization and gas phase polymerization. Reducing a polymer obtained by solution polymerization or gas phase polymerization to fine grains can be conducted, for example, in a manner that an electrolyte is added to an organic solvent solution of a polymer, and sprayed into inert gas and dried to form particulates. Alternatively, a polymer is dissolved in a water-immiscible organic solvent and the obtained solution is dispersed in water or an aqueous medium, followed by removal of the organic solvent by distillation to form particulates. In these methods, surfactants such as sodium laurate, sodium dodecylbenzenesulfonate and polyethylene glycoland water-soluble resins such as polyvinyl alcohol may optionally be used as a dispersing agent or a stabilizer in polymerization or formation of the particulates.

The thermoplastic particulates are preferably water-dispersible, preferably having an average particulate size of 0.01 to 10 μm, and more preferably 0.4 to 3 μm. In cases when the average particulate size is less than 0.01 μm, heat-melting material easily enters pores of the hydrophilic layer or fine gaps on the hydrophilic layer surface, or insufficient results, producing concern of causing background staining. An average particulate size of a heat-melting material of more than 10 μm results in lowered resolution.

The heat-melting material may continuously vary from the interior to the uppermost surface or is covered with different material. There are applicable covering methods such as commonly known micro-capsulation method and sol-gel method. The content of a heat-melting material is preferably 1% to 90%, and more preferably 5 to 80% by weight of the whole layer.

In this invention, the uppermost surface in an unexposed area of the image forming layer provided on the hydrophilic layer exhibits a glossiness of 0.1 to 10.0. The glossiness was measured at an angle of 60° with respect to both incident light and reflection light. A glossiness of more than 10 lowers contrast between exposed and unexposed areas. This contrast is affected by the surface glossiness. Two or more heat-melting materials differing in particle size or material may be mixed to adjust the surface glossiness to this range.

Further, organic or inorganic white pigments or fillers exhibiting a relatively high refractive index, or commonly known brighteners may be added to form a milky-white image forming layer. Examples of preferred inorganic white pigments include titanium oxide, calcium carbonate, barium carbonate, barium sulfate, aluminum oxide, silicon dioxide, zinc oxide, clay, kaolin clay and talc. Examples of organic white pigments usable in this invention include cured particulates such as polyamide, acryl and acryl-styrene copolymer, hollow particles, core-shell type particles, and commonly known organic fillers such as alkylene bis-melamine derivatives and polymethyl methacrylate. These organic or inorganic, white fillers may be added to heat-melting material. The white pigment or filler preferably has an average particle size of 0.4 to 3 μm. An average particle size of less than 0.4 μm results in difficulty to lower the gloss and results in reduced contrast. An average particle size of more than 3 μm results in unfavorable background staining and deteriorated performance. Incorporation of a white pigment or a filler to the image forming layer is preferably 1% to 20% by weight.

Water-soluble Material

The image forming layer containing heat-melting and/or heat-fusible particulates may further contain a water-soluble material. When removing unexposed areas of the image forming layer on the printing machine with an aqueous dampening liquid or an ink, incorporation of a water-soluble material results in enhanced removal thereof. Water-soluble resins described earlier as materials usable in the hydrophilic layer may also be used as water-soluble materials, and the use of saccharides is preferred and the use of oligosaccharides is more preferred.

Oligosaccharides are dissolved in water so promptly that removal of unexposed areas of the image forming layer on the printing machine is promoted and printing can be started in a manner similar to conventional PS plates, without being concerned about any specific operation, and no increased paper waste occurs at the start of a printing run. Further, the use of oligosaccharides results in no lowering of hydrophilicity of the image forming layer and can maintain superior printing suitability of the hydrophilic layer.

Oligosaccharides are in general water-soluble crystalline substances having a sweet taste, which are formed of plural monosaccharides through glucoside linkage by dehydration condensation. An oligosaccharide, which is a kind of a O-glycoside having sugar as an aglycone, is easily hydrolyzed in an acid to form a monosaccharide. The formed saccharide is classified as disaccharide, trisaccharide, tetrasaccharide or pentasaccharide based on the number of monosaccharide units. Oligosaccharides usable in this invention refer to a disaccharide to a decasaccharide inclusive. Oligosaccharides are mainly classified into a reducing oligosaccharide and a non-reducing oligosaccharide in accordance with the presence/absence of a reducing group and are also classified into a homooligosaccharide comprised of a single kind of a monosaccharide and hetero-oligosaccharide comprised of two or more kinds of monosaccharides.

Oligosaccharides exist naturally in a free form or as a glycoside and can also be obtained by acid or enzyme hydrolysis of polysaccharides. Further, various oligosaccharides can be obtained by glycosylation using enzymes. Oligosaccharides often exist in the form of a hydrate under a usual atmosphere. A hydrate and an anhydrate differ in melting point and specific examples thereof are shown below:

TABLE 1

| | Melting Point (° C.) | |
|---|---|---|
| Oligosaccharide | Hydrate | Anhydrate |
| raffinose: trisaccharide | 80 (pentahydrate) | 118 |
| trehalose: disaccharide | 97 (dihydrate) | 215 |
| maltose: disaccharide | 103 (monohydrate) | 108 |
| galactose: disaccharide | 119 (monohydrate) | 167 |
| sucrose: disaccharide | — | 182 |
| lactose: disaccharide | 201 (monohydrate) | 252 |

Aqueous solution coating to form a saccharide-containing layer is preferred in this invention. In cases when the layer is formed of an aqueous solution, the contained oligosaccharide capable of forming a hydrate is assumed to have a melting point equivalent to that of the hydrate. Since its melting point is relatively low, the oligosaccharide also melts within the melting temperature range of heat-melting particulates or within the heat-fusion temperature range of heat-fusible particulates, without causing melt permeation of the heat-melting particulates into or fusion of the heat-fusible particulates onto the porous hydrophilic layer and preventing image formation. Of oligosaccharides, trehalose, which is industrially inexpensively available, in a relatively high-pure state, exhibits very low hygroscopicity, irrespective of its high solubility in water, leading to superior developability on press and storage stability.

The oligosaccharide hydrate is melted, dehydrated and coagulated to form a crystalline anhydrate within a short time after coagulation. Trehalose is characterized in that the melting point of its anhydrate is higher by at least 100° C. than that of its hydrate. This means that immediately after heat-melting upon exposure to infrared rays and then coagulated, exposed areas exhibit a high melting point and became difficult to be melted, leading to an advantageous effect of rendering it difficult to cause image defects in exposure, such as banding. Of oligosaccharides, trehalose is specifically preferred to achieve the object of this invention. The oligosaccharide content is preferably 1% to 90%, and more preferably 10% to 80% by weight, based on the entire layer.

Light-to-Heat Conversion Material

The hydrophilic layer, under-layer or image forming layer preferably contains a specific light-to-heat conversion material, thereby achieving high sensitivity.

Metal oxides described below can be incorporated, as a light-to-heat conversion material, to the hydrophilic layer. Thus, material appearing black under visible light, or electrically conductive or semi-conductive material can be used in this invention. Examples of the former include black iron oxide ($Fe_3O_4$) and black composite metal oxides containing at least two kinds of metals. Examples of the latter include Sb-doped $SnO_2$ (ATO), Sn-incorporated $In_2O_3$ (ITO), $TiO_2$, and TiO obtained by reduction of $TiO_2$ (titanium oxide nitride or titanium black). There are also usable the foregoing metal oxides coating core material (e.g., $BaSO_4$, $TiO_2$, $9Al_2O_3.2B_2O$, $K_2O.nTiO_2$). These have a particle size of not more than 0.5 μm, preferably not more than 100 nm, and more preferably not more than 50 nm.

Of the foregoing light-to-heat conversion materials, a black composite metal oxide containing at least two kinds of metal is preferred, which is a composite metal oxide containing at least two metals selected from Al, Ti, Cr, Mn, Fe, Co, Ni, Cu, Zn, Sb and Ba. These composite metal oxide can be prepared by employing methods described in JP-A Nos. 8-27393, 9-25126, 9-237570, 9-241529, and 10-231441. Of composite metal oxides, Cu, Cr and Mn containing or Cu, Fe and Mn containing composite metal oxide is preferred in this invention. The Cu, Cr and Mn containing metal oxide is preferably subjected to a treatment to prevent elution of hexa-valent chromium, as described in JP-A No. 8-273393. The composite metal oxide exhibits coloring vs. an addition quantity, that is, superior light-to-heat conversion efficiency.

The foregoing composite metal oxide preferably has an average primary grain size of not more than 1 μm, and more preferably 0.01 to 0.5 μm. An average primary grain size of not more than 1 μm results in enhanced light-to-heat convertibility vs. an adding quantity, and an average primary grain size of 0.01 to 0.5 μm results in further enhanced light-to-heat convertibility vs. an addition quantity. The light-to-heat convertibility is greatly affected by the degree of dispersion of grain dispersibility. Superior degree of dispersion leads to superior light-to-heat convertibility. Therefore, composite metal oxide grains, prior to addition to layer coating solution, are preferably dispersed by commonly known methods to form a dispersion (paste). An average primary grain size of less than 0.01 μm renders dispersion difficult. Dispersing agents can optionally be used in a dispersion. A dispersing agent is added preferably in an amount of 0.01% to 5%, and more preferably 0.1% to 2% by weight, based on the composite metal oxide grains. The composite metal oxide is added in an amount of not less than 20%, preferably not less than 25% and less than 40%, and more preferably not less than 25% and less than 30%, based on the total solids of the hydrophilic layer. An addition of less than 20% cannot achieve sufficient sensitivity and an addition of not less than 40% produces ablation trash.

The image forming layer may be added with the following infrared absorbing dyes. Examples of generally used infrared absorbing dyes include organic compounds such as cyanine type dyes, croconium type dyes, polymethine type dyes, azulenium type dyes, squalium type dyes, thiopyrylium type dyes, naphthoquinone type dyes, and anthraquinone type dyes; and organic metal complex compounds such as a phthalocyanine type, naphthalocyanine type azo type, thioamido type, dithiol type and indoaniline type. Specific examples of such compounds are described in JP-A Nos. 63-139191, 64-33547, 1-160683, 1-280750, 1-293342, 2-2074, 3-26593, 3-30991, 3-34891, 3-36093, 3-36094, 3-36095, 3-42281, 3-97589, and 3-103476. These compounds may be used singly or in combinations. An infrared absorbing dye is added in an amount of not less than 0.1% and less than 10%, preferably not less than 0.3% and less than 7%, and more preferably not less than 0.5% and less than 6%, based on total solids of the image forming layer. An addition of less than 0.1% does not result in sufficient sensitivity and an addition of not less than 10% produces ablation trash.

An infrared absorbing dye to be added to the image forming layer is preferably one which does not exhibit much visible absorption. Excessive visible absorption colors the image forming layer, reducing contrast between exposed and unexposed areas. Dyes exhibiting less visible absorption include, for example, phthalocyanine type or naphthalocyanine type pigments and squalium dyes. Of these dyes, water-insoluble ones are dispersible employing commonly known methods.

Image Formation of Printing Plate Material

Although image formation of the printing plate material according to this invention can be performed thermally, image formation by exposure to an infrared laser is preferred. Specifically, scanning exposure using lasers emitting in the infrared and/or near-infrared region, that is, lasers emitting in the wavelength region of 700 to 1500 nm are preferred. A gas laser may be used and the use of semiconductor lasers emitting in the near-infrared region is specifically preferred.

There is usable an imaging apparatus of any system which is capable of forming images on the surface of printing plate material in accordance with image signals outputted from a computer by using a semiconductor laser. In general, the following exposure systems are cited:

(1) a system in which a printing plate material is held on a planar holding mechanism and is overall subjected to two-dimensional scanning exposure using single or plural laser beams;

(2) a system in which a printing plate material is held inside a fixed cylindrical holding mechanism and along the internal cylindrical surface, and is overall exposed from the inside of the cylinder by performing scanning in the circumferential direction (main scanning direction) using one or more laser beams, while moving in the direction vertical to the circumferential direction (sub-scanning direction); and (3) a system in which a printing plate material is held on the surface of a cylindrical drum which rotates on a central shaft and is overall exposed from the outside of the cylinder by performing scanning in the circumferential direction (main scanning direction) using one or more laser beams, while moving in the direction vertical to the circumferential direction (sub-scanning direction).

EXAMPLES

The present invention will be further described based on examples but embodiments of this invention are by no means limited to these.

Substrate 1

On both sides of a 175 μm thick transparent polyethylene terephthalate (PET) film, the following sublayers were coated according to the procedure described below and designated as substrate 1. The transmission density of the substrate 1 was determined using a Macbeth densitometer TD 904 and the black-and-white density (visual) was 0.04.

1) First Sublayer

After the coating side surface of the PET substrate was subjected to corona discharge, a coating solution having the following composition was coated by a wire-bar under an atmosphere at 20° C. and 55% RH so that the dry layer thickness was 0.4 μm.

| First sublayer coating composition | |
|---|---|
| Acryl latex particles: n-butylacrylate/t-butylacrylate/styrene/hydroxylethyl methacrylate = 28/22/25/25 | 36.9 g |
| Surfactant (A) | 0.36 g |
| Hardener (a) | 0.98 g |

Distilled water was added to make 1 liter to obtain a coating solution.

2) Second Sublayer

After the surface of the side forming the first sublayer was subjected to corona discharge, a coating solution having the following composition was coated by a air-knife system under an atmosphere at 35° C. and 22% RH so that the dry layer thickness was 0.1 μm. Thereafter, drying was conducted at 140° C. for 2 min.

| Second sublayer coating composition | |
|---|---|
| Gelatin | 9.6 g |
| Surfactant (A) | 0.4 g |
| Hardener (b) | 0.1 g |

Distilled water was added to make 1 liter to obtain a coating solution.

Surfactant (A)

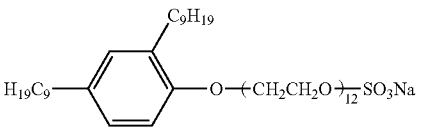

Hardener (a)

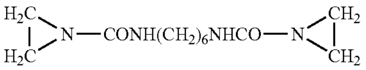

Hardener (b)

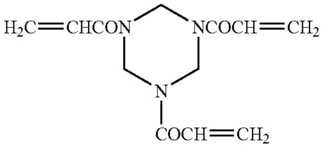

Substrate 2

Substrate 2 was prepared similarly to the foregoing substrate 1, except that a 175 μm thick blue-tinted transparent PET film used for radiographic material was used. The transmission density of the substrate 2 was 0.17.

Preparation of Under-layer Coating Solution

After the following composition was sufficiently stirred using a homogenizer and filtered, sublayer coating solutions were prepared.

TABLE 2

| Coating Composition | Under-layer 1 | Under-layer 2 | Under-layer 3 | Under-layer 4 |
|---|---|---|---|---|
| Colloidal silica (alkali type)*[1] | 81.94 g | 66.94 g | 61.94 g | 57.89 g |
| Porous metal oxide particle*[2] | 2.22 g | 2.22 g | 2.22 g | 2.08 g |
| Lamellar mineral particle montmorillonite*[3] | 0.22 g | 0.22 g | 0.22 g | 0.21 g |
| Cu—Fe—Mn metal oxide black pigment*[4] | 2.5 g | 10.0 g | 12.5 g | 14.95 g |
| Aqueous 4% solution of sodium carboxymethyl cellulose*[5] | 0.11 g | 0.11 g | 0.11 g | 0.10 g |
| Aqueous 10% solution of sodium phosphate · 12 $H_2O$*[6] | 0.06 g | 0.06 g | 0.06 g | 0.05 g |
| Pure water | 12.95 g | 20.45 g | 22.95 g | 24.72 g |
| Solid percentage (by weight) | 20% | 20% | 20% | 20% |

*[1]SNOWTEX XS (Nissan Kagaku Co., 20% solid)
*[2]Silton JC-40 (Mizusawa Kagaku Co., porous aluminosilicate particles having an average size of 4 μm)
*[3]Mineral Colloid MO (Southern Cray Product Co., average particle size of 0.1 μm) 5% water-swelled gel (strongly stirred with a homogenizer)
*[4]TM-3550 black powder (Dainichiseika Kogyo Co., particle size ca. 0.1 μm) aqueous dispersion of 40% solids (including 0.2% dispersing agent)
*[5]Product by Kanto Kagaku Co.
*[6]Product by Kanto Kagaku Co.

Preparation of Hydrophilic Layer Coating Solution

After the following composition was sufficiently stirred using a homogenizer and filtered, hydrophilic layer (1) coating solutions was prepared.

TABLE 3

| Coating Composition | Hydrophilic Layer (1) |
|---|---|
| Colloidal silica (alkali type)*[1] | 10.4 g |
| Necklace-form colloidal silica (alkali type)*[2] | 23.4 g |
| Porous metal oxide particle*[3] | 1.2 g |
| Porous metal oxide particle*[4] | 1.5 g |
| Lamellar mineral particle montmorillonite*[5] | 4.8 g |
| Cu—Fe—Mn metal oxide black pigment*[6] | 2.7 g |
| Aqueous 4% solution of sodium carboxymethyl cellulose*[7] | 3.0 g |
| Aqueous 10% solution of sodium phosphate · 12 $H_2O$*[8] | 0.6 g |
| Pure water | 52.4 g |
| Solid percentage (by weight) | 12% |

*[1]SNOWTEX S (Nissan Kagaku Co., 30% solid)
*[2]SNOWTEX PSM (Nissan Kagaku Co., 20% solid)
*[3]Silton JC-20 (Mizusawa Kagaku Co., porous aluminosilicate particles having an average size of 2 μm)
*[4]Silton AMT-08 (Mizusawa Kagaku Co., porous alumino-silicate particles having an average size of 0.6 μm)
*[5]Mineral Colloid MO (Southern Cray Product Co., average particle size of 0.1 μm) 5% water-swelled gel (strongly stirred with a homogenizer)
*[6]TM-3550 black powder (Dainichiseika Kogyo Co., particle size ca. 0.1 μm) aqueous dispersion of 40% solids (including 0.2% dispersing agent)
*[7]Product by Kanto Kagaku Co.
*[8]Product by Kanto Kagaku Co.

Coating of Under-layer and Hydrophilic Layer

Each of the foregoing under-layer coating solutions was coated on the substrate 1 or 2 using a #5 wire-bar and allowed to pass at a speed of 15 m/min through a 15 m long drying zone set at 100° C. Subsequently, further thereon, the hydrophilic layer coating solution described above was coated using a #4 wire-bar and allowed to pass at a speed of 15 m/min through a 30 m long drying zone set at 100° C. Coating amounts of the under-layer and hydrophilic layer were 3.0 $g/m^2$ and 0.55 $g/m^2$. After completion of coating, samples were aged at 60° C. for one day.

Preparation of Image Forming Layer Coating Solution

To 5.21 g of pure water were added 0.474 g of EX Color IR 14 (phthalocyanine dye, product by Nippon Shokubai Co.), 1.2 g of 10% aqueous solution of PVA (PVA 217, product by KURARAY CO. LTD.) and 0.12 g of an aqueous 5% solution of surfactant (SF 465, product by Nisshin Kagaku Co.), microbeads were further added thereto and stirred using a homogenizer at 8,000 rpm. After removing the microbeads, 9.14 g of pure water was added to obtain an aqueous dispersion of light-to-heat conversion material (A).

An image forming layer having the composition shown in Tables 4 and 5 was coated onto the hydrophilic layer using a #5 wire-bar and allowed to pass at a speed of 15 m/min through a 30 m long drying zone set at 60° C. The coating amount of the image forming layer was 0.5 $g/m^2$.

TABLE 4

| | Image Forming Layer | | | | | |
|---|---|---|---|---|---|---|
| Coating Composition | 1 | 2 | 3 | 4 | 5 | 6 |
| carnauba wax emulsion A118*1 | 9.84 g | 6.30 g | — | — | — | — |
| carnauba wax emulsion XD-147*2 | — | 11.81 g | 25.56 g | — | — | — |
| carnauba wax emulsion AD-90*3 | — | — | — | 27.56 g | — | — |
| polyethylene wax A-777*4 | — | — | — | — | 11.03 g | — |
| paraffin wax emulsion H 808*5 | — | — | — | — | — | 14.23 g |
| High Micron L-271*6 | 1.89 g | — | — | — | — | — |
| 10% aqueous solution of disaccharide trehalose powder*7 | 18.9 g | 18.9 g | 18.9 g | 18.9 g | 18.9 g | 18.9 g |
| Pure water | 69.37 g | 62.99 g | 53.54 g | 53.56 g | 70.08 g | 66.87 g |
| Solid percentage (by weight) | 6.3% | 6.3% | 6.3% | 6.3% | 6.3% | 6.3% |

*1product by Gifu Cerac Co., average particle size: 0.3 μm, 40% solids
*2product by Gifu Cerac Co., average particle size: 1.0 μm, 16% solids
*3product by Gifu Cerac Co., average particle size: 0.2 μm, 8.8% solids
*4product by Gifu Cerac Co., average particle size: 1.8 μm, 40% solids
*5product by Chukyo Yushi Co., average particle size: 0.5 μm, 31% solids
*6product by Chukyo Yushi Co., average particle size: 0.25 μm, 25% solids
*7product by Hayashibara Shoji Co.

TABLE 5

| | Image Forming Layer | |
|---|---|---|
| Coating Composition | 7 | 8 |
| carnauba wax emulsion A118*1 | 9.84 g | 5.12 g |
| carnauba wax emulsion XD-147*2 | — | 11.81 g |
| PMMA particle: aqueous dispersion of MX 400*3 | 6.30 g | — |
| light-to-heat conversion material (A): aqueous 3.8% dispersion of IR14*4 | — | 4.97 g |
| High Micron L-271*5 | 1.89 g | 1.89 g |
| 10% aqueous solution of disaccharide trehalose powder*6 | 12.6 g | 17.01 g |
| Pure water | 69.37 g | 59.2 g |
| Solid percentage (by weight) | 6.3% | 6.3% |

*1product by Gifu Cerac Co., average particle size: 0.3 μm, 40% solids
*2product by Gifu Cerac Co., average particle size: 1.0 μm, 16% solids
*3product by Sokenkagaku Co., average particle size: 4.0 μm
*4product by Nippon Shokubai Co.
*5product by Chukyo Yushi Co., average particle size: 0.25 μm, 25% solids
*6product by Hayashibara Shoji Co.

Printing plate material samples 001 through 011 obtained by combinations of the foregoing substrates, under-layers, hydrophilic layers and image forming layers are shown in Table 6, including physical properties thereof.

Using a Macbeth densitometer TD904, the transmission density of the substrate having an under-layer and a hydrophilic layer was determined, based on black-and-white density (visual). Using a glossmeter, the glossiness of the uppermost surface of the image forming layer of a printing plate material was measured as the glossiness of the image forming layer. The measuring angle was 60° with respect to both incident light and reflection light.

TABLE 6

| Sample No. | Substrate | Under-layer | Hydrophilic Layer | Transmission Density | Image Forming Layer | Glossiness | Remark |
|---|---|---|---|---|---|---|---|
| 001 | 1 | 1*1 | 1*2 | 0.33 | 1 | 15.0 | Comp. |
| 002 | 1 | 1 | 1 | 0.33 | 4 | 20.0 | Comp. |
| 003 | 2 | 1 | 1 | 0.55 | 3 | 3.2 | Inv. |
| 004 | 1 | 2*3 | 1 | 0.84 | 1 | 13.0 | Comp. |
| 005 | 2 | 2 | 1 | 0.91 | 2 | 8.4 | Inv. |
| 006 | 1 | 2 | 1 | 0.84 | 3 | 1.2 | Inv. |
| 007 | 1 | 2 | 1 | 0.84 | 5 | 5.6 | Inv. |
| 008 | 1 | 2 | 1 | 0.84 | 8 | 4.0 | Inv. |
| 009 | 1 | 3*4 | 1 | 0.94 | 3 | 0.8 | Inv. |
| 010 | 1 | 3 | 1 | 0.94 | 6 | 6.1 | Inv. |
| 011 | 1 | 3 | 1 | 0.94 | 7 | 11.2 | Comp. |

*1light-to-heat conversion material: 5%
*2light-to-heat conversion material: 9%
*3light-to-heat conversion material: 20%
*4light-to-heat conversion material: 25%

Image Formation

Printing plate material samples were each wound around an exposing drum. Exposure was conducted using a laser beam of an 18 μm spot diameter and an 830 nm wavelength. Image formation was carried out at 2400 dpi (dot number per 2.54 cm) and 175 lines under the exposure energy of 100, 150, 200, 250 and 300 mj/$cm^2$ to obtain printing plates 001 through 011.

Printing

The thus exposed printing plates were each set on a plate cylinder of a printing machine DAIYA 1F-1 (Mitsubishi Jukogyo Co., Ltd.) and printing was conducted using coated paper and aqueous dampening liquid Astro Mark 3 (2 wt %, available from Nikken Kagaku Kenkyusho) and ink (Toyo King Highecho M magenta, available from Toyo Ink Seizo Co., Ltd.). The sequence at the start of printing was carried out at a printing sequence of a PS plate and specific development on press was not done.

Sensitivity

Using a Macbeth dot meter, a 100th print sample from the start of printing was measured with respect to reproduction of 50% dots of imaged areas and an energy value at which a measured value of 49% to 51% was observed was defined as proper sensitivity.

Image Visibility after Exposure

The exposed printing plate material was placed with the image forming layer upward and evaluated visually or using a magnifier with respect to image visibility after exposure, while being illuminated with white light. Results are shown in Table 7. Evaluation was made based on the following criteria, Visual Observation:

A: excellent,

B: superior,

C: slightly inferior,

D: inferior,

Magnifier Observation:

A: line and space images were clearly observed,

B: 2% to 90% dots were recognized,

C: dots were unclearly recognized,

D: dots were difficult to be recognized.

Using Gretag SPM100, the difference (ΔE) in Lab value between exposed and unexposed areas was determined, which was determined from the Lab values obtained in measurements on a white background in the manner described earlier.

TABLE 7

| | Sensitivity | Image Visibility | | |
|---|---|---|---|---|
| No. | (mJ/$cm^2$) | Visual | Magnifier | ΔE |
| 001 | 300 | C | C | 0.77 |
| 002 | 200 | D | D | 0.12 |
| 003 | 250 | B | B | 7.23 |
| 004 | 200 | D | D | 5.91 |
| 005 | 200 | B | B | 9.03 |
| 006 | 200 | A | A | 13.09 |
| 007 | 250 | B | B | 7.57 |
| 008 | 100 | B | B | 7.84 |
| 009 | 150 | A | A | 18.91 |
| 010 | 100 | A | A | 13.25 |
| 011 | 150 | C | D | 4.21 |

According to this invention, printing plate materials exhibiting superior visibility were obtained even in a printing plate material having a flexible support (PET).

What is claimed is:

1. A lithographic printing plate material comprising a plastic flexible support having thereon an underlayer, a hydrophilic layer and an image forming layer, wherein the plastic flexible support having the underlayer and the hydrophilic layer exhibits a transmission density of 0.5 to 1.2, and the outermost surface of an unexposed area of the image forming layer exhibiting a glossiness of 0.1 to 10.

2. The material of claim 1, wherein the image forming layer contains a heat-melting material exhibiting a melting point of 40 to 300° C.

3. The material of claim 2, wherein the heat-melting material is at least one selected from the group consisting of a paraffin, a polyolefin, a polyethylene wax, a microcrystalline wax and a fatty acid wax.

4. The material of claim 2, wherein the heat-melting material is comprised of particles having an average particle size of 0.4 to 3.0 μm.

5. The material of claim 1, wherein the image forming layer contains thermoplastic polymer particles.

6. The material of claim 1, wherein the support is colored.

7. The material of claim 1, wherein the material exhibits a difference in La*b* value obtained in white backing between exposed and unexposed areas (ΔE) of 6 to 20.

8. The material of claim 1, wherein the image forming layer contains an oligosaccharide.

9. The material of claim 1, wherein the hydrophilic layer contains metal oxide particles.

10. The material of claim 1, wherein at least one of the image forming layer, the hydrophilic layer and the underlayer contains a light-to-heat conversion material.

11. A printing method comprising:

(a) exposing a printing plate material to a laser or an infrared ray based on image information and (b) performing printing with supplying an aqueous dampening liquid and an ink to the exposed printing plate material, wherein the printing plate material comprises a plastic flexible support having thereon an underlayer, a hydrophilic layer and an image forming layer, and the plastic flexible support having the underlayer and the hydrophilic layer exhibiting a transmission density of 0.5 to 1.2 and the outermost surface of an unexposed area of the image forming layer exhibiting a glossiness of 0.1 to 10.

12. The method of claim 11, wherein the image forming layer contains a heat-melting material exhibiting a melting point of 40 to 300° C.

13. The method of claim 12, wherein the heat-melting material is at least one selected from the group consisting of a paraffin, a polyolefin, a polyethylene wax, a microcrystalline wax and a fatty acid wax.

14. The method of claim 12, wherein the heat-melting material is comprised of particles having an average particle size of 0.4 to 3.0 μm.

15. The method of claim 11, wherein the image forming layer contains thermoplastic polymer particles.

16. The method of claim 11, wherein the support is colored.

17. The method of claim 11, wherein the material exhibits a difference in La*b* value obtained in white backing between exposed and unexposed areas (ΔE) of 6 to 20.

18. The method of claim 11, wherein the image forming layer contains an oligosaccharide.

19. The method of claim 11, wherein the hydrophilic layer contains metal oxide particles.

20. The method of claim 11, wherein at least one of the image forming layer, the hydrophilic layer and the underlayer contains a light-to-heat conversion material.

* * * * *